(12) United States Patent
Liang et al.

(10) Patent No.: US 6,265,769 B1
(45) Date of Patent: Jul. 24, 2001

(54) DOUBLE-SIDED CHIP MOUNT PACKAGE

(75) Inventors: Jimmy Liang, Taipei; Johnny Cheng, Yung-Ho; Justin Kong, Chun-Ho, all of (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/191,487

(22) Filed: Nov. 13, 1998

Related U.S. Application Data

(60) Provisional application No. 60/065,330, filed on Nov. 13, 1997.

(51) Int. Cl.[7] .................................................... H01L 23/48
(52) U.S. Cl. .............................................. 257/688; 257/98
(58) Field of Search ...................................... 257/688, 98

(56) References Cited

U.S. PATENT DOCUMENTS

| | | |
|---|---|---|
| 4,396,936 | 8/1983 | McIver et al. .......................... 357/81 |
| 5,152,057 | 10/1992 | Murphy .................................. 29/883 |
| 5,200,810 | 4/1993 | Wojnarowski et al. ............... 361/398 |
| 5,280,409 | 1/1994 | Selna et al. ........................... 361/720 |
| 5,397,917 | 3/1995 | Ommen ................................. 257/698 |
| 5,455,457 * | 10/1995 | Kurokawa ............................. 257/704 |
| 5,508,561 | 4/1996 | Tago et al. ............................ 257/737 |
| 5,710,459 * | 1/1998 | Teng et al. ............................ 257/704 |
| 5,793,104 * | 8/1998 | Kirkman ................................ 257/704 |

* cited by examiner

*Primary Examiner*—Roy Potter
(74) *Attorney, Agent, or Firm*—Alan K. Stewart; Wade James Brady, III; Frederick J. Telecky, Jr.

(57) ABSTRACT

The invention is a semiconductor package (10) and to the method of making in which the backside (23) of a semiconductor die (13) is mounted to one part of a package (11) with an adhesive (12) which may be both thermally and electrically conductive. The face (22) of the semiconductor die (13) is attached to a second part of the package (18) to direct heat away form the face (22) of the semiconductor die (13).

5 Claims, 2 Drawing Sheets

DOUBLE-SIDED CHIP MOUNT PACKAGE

This application claims priority under 35 USC § 119(e)(1) of provisional application No. 60/065,330 filed Nov. 13, 1997.

FIELD OF THE INVENTION

This invention relates to semiconductor packages, and more particularly to a double-sided semiconductor chip package providing a thermal path from both sides of the semiconductor chip, and to the method of making.

BACKGROUND OF THE INVENTION

When semiconductor chips are mounted in the conventional manner, the contact pads on the face of the semiconductor die are wire bonded to lead frame leads, and the back side of the die may or may not be connected to a ground plane or heat spreader.

Flip-chip semiconductors have solder ball contacts on the face side of the die that are connected to a printed circuit base which may be part of the semiconductor package. The back side of the die may be in contact with the semiconductor package, or may be mounted to a heat spreader.

In both of the above devices, heat is basically dissipated only through the back side of the die. The heat generated at the circuit surface of the semiconductor die does not have a good heat dissipation path away from the face of the semiconductor die.

U.S. Pat. No. 5,311,059 discloses backplane grounding for flip-chip integrated circuits, but does not suggest means for removing heat from the face of the device.

U.S. Pat. No. 5,280,409 describes an apparatus for providing a heat sink and protective cover for a Tape Automated Bonding (TAB) integrated circuit device. A printed circuit board has a plurality of thermal vias drilled through it and the TAB device is then mounted on the opposite side of the printed circuit board adjacent to the thermal vias.

Another patent, U.S. Pat. No. 4,396,936 discusses an integrated circuit package with flexible beam leads and the die is mounted active face down on the top of a substrate. A preform comprising a segment of a fiber glass web coated with a thermosetting and thermally conductive plastic is positioned between the chip pad and the active face of the chip. A plurality of thermal passages are formed through the substrate interconnecting the chip face and a heat sink pad.

SUMMARY OF THE INVENTION

The invention is a semiconductor package in which both the face and bottom side of the semiconductor die are attached to the package. The backside of the die can be attached to a heat spreader with an electrically conductive adhesive. The active side or face of the die is attached to the package with a non-electrical conductive adhesive to allow heat transfer from the face of the die. The adhesives used for attaching both the face and backside of the die have good thermal transfer properties.

DESCRIPTION OF A PREFERRED EMBODIMENT

Figure 1:
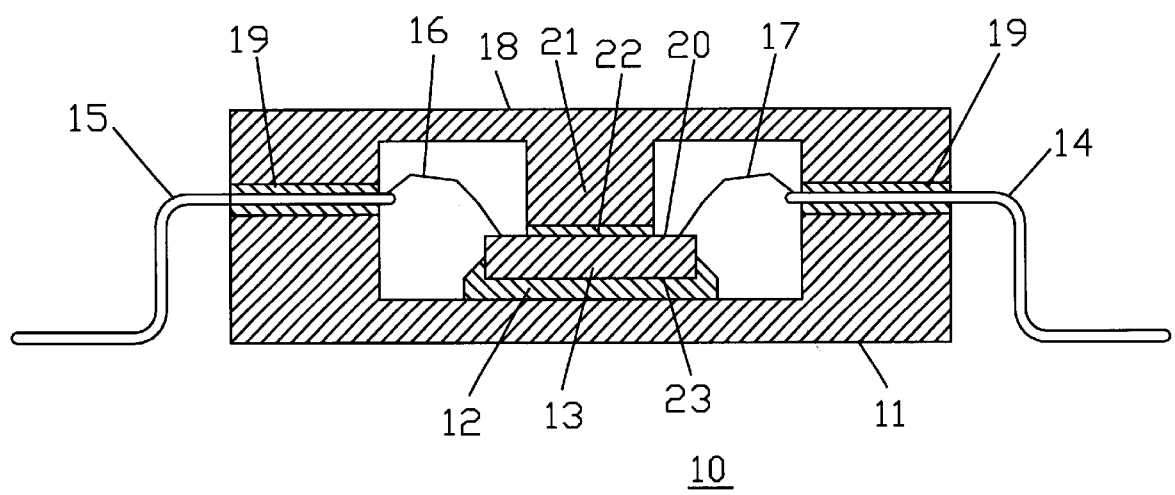
FIG. 1 is a cross-sectional view of a first embodiment of the invention.

FIG. 1 shows a ceramic quad semiconductor package (CerQuad) 10 in which a semiconductor die 13 is sealed by its backside 23 to a ceramic base 11 with a an adhesive 12. Adhesive 12 is a thermal conductive adhesive. Adhesive 12 may also be electrically conductive such as silver filled epoxy or a silver filled glass adhesive. An example of a silver filled glass is QMI 3555, manufactured by Quantum Materials Inc. A Cerquad package has a plurality of leads extending out four sides of the package. In the cross-sectional view of FIG. 1, two leads 14 and 15 are shown extending from opposite sides of the package 11. Lead 14 is electrically attached to die 13 by bond wire 17, and lead 15 is electrically attached to die 13 by bond wire 16. Package lid 18 is sealed to package base 11 around the periphery by an adhesive 19 which also seals around the leads, for example as illustrated, leads 14 and 15.

Lid 18 has a projection 21 that is sealed to the face 20 of semiconductor 13 by a heat conductive, non-electrically conductive adhesive 22. Adhesive 22 must be non-electrically conductive since it is in contact with the face of semiconductor die 13 which contains the layer in which the device circuitry is formed. It is this layer that produces the heat generated in die 13. The heat produced in the face of the device 13 is difficult to disburse since the thermal conductivity of silicon is low and the amount of thermal flow through die 13 to the backside 23 is low. By sealing the front side 20 of die 13 to projection 21 of lid 18 with a thermally conductive and non-electrically conductive adhesive, additional heat is removed from die 13, providing an enhanced thermally conductive package. Similarly, base 11 may be ceramic and lid 18 a metal lid heat spreader with adhesive 19 insulating the leads (14 and 15) form metal lid 18.

In the above embodiment, the package base 11 and lid 18 are ceramic, but they may also be metal as long as the leads 14 and 15 are adequately insulated from the base 11 and lid 18 by a non-electrically adhesive 19.

Figure 2:
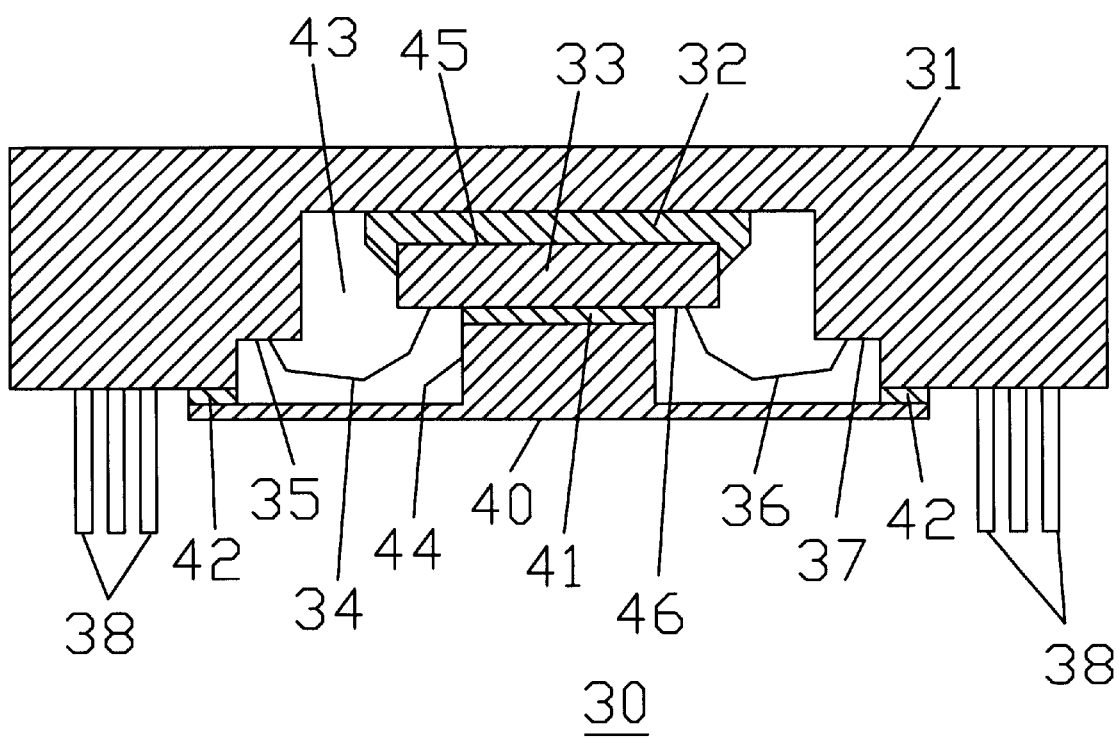
FIG. 2 is a second embodiment of the invention.

FIG. 2 is an embodiment of the invention utilizing a Ceramic Pin Grid Array (CPGA) package 30. In this embodiment, a base 31 has a cavity or recess 43 in which semiconductor die 33 is mounted at its base 45 in recess 43 by an adhesive 32, which may be, for example, a thermally and electrically conductive adhesive 32. Adhesive 32 may be, for example, a silver filled epoxy or silver filled glass adhesive. Examples of these adhesives are QMI 3555, manufactured by Quantum Materials Inc.

Semiconductor die 33 interconnects with and is connected to conductors (not illustrated) that extends from areas 35 and 37 on base 31 to external pins 38. Bond wires, for example bond wires 34 and 36, interconnect die 33 via the conductors to pins 38. Package 30 is sealed with lid 40 by adhesive 42. Projection 44 of lid 42 is sealed to the face 46 of die 33 by a thermally conductive, electrically non-conductive adhesive. An example of such adhesive is Isstaystick 611, manufactured by Alpha Metals Inc.

Lid 40 may be either ceramic or metal as long as it is properly electrically insulated from the face 46 of semiconductor die 33 by adhesive 41. Lid 40 may be a heat spreader to direct heat away from the face 41 of die 33.

What is claimed is:

1. A semiconductor device, comprising:

a package base;

a semiconductor die having a backside and a face side;

an electrically conductive adhesive attaching the backside to the package base;

a package lid sealed to the face side of the semiconductor die with a non-electrical conductive adhesive; and a plurality of leads interconnect with the face of the semiconductor die.

2. The package according to claim 1, wherein the electrically conductive adhesive is one of a silver filled epoxy and a silver filled glass adhesive.

3. The package according to claim 1, including a heat spreader attached to, but insulated from, the face of the semiconductor die.

4. A semiconductor device, comprising:

a package base;

a semiconductor die having a backside and a face side;

an electrically conductive adhesive attaching the backside to the package base;

a heat spreader lid sealed to the face side of the semiconductor die with a non-electrical conductive adhesive; and a plurality of leads interconnecting with the face side of the semiconductor die.

5. The package according to claim 6, wherein the electrically conductive adhesive is one of a silver filled epoxy and a silver filled glass adhesive.

* * * * *